US010903356B2

(12) United States Patent
Edwards et al.

(10) Patent No.: US 10,903,356 B2
(45) Date of Patent: *Jan. 26, 2021

(54) LDMOS DEVICE WITH BODY DIFFUSION SELF-ALIGNED TO GATE

(71) Applicant: Texas Instruments Incorporated, Dallas, TX (US)

(72) Inventors: Henry Litzmann Edwards, Garland, TX (US); Binghua Hu, Plano, TX (US); James Robert Todd, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/865,028

(22) Filed: Jan. 8, 2018

(65) Prior Publication Data

US 2018/0151722 A1  May 31, 2018

Related U.S. Application Data

(62) Division of application No. 14/957,223, filed on Dec. 2, 2015, now Pat. No. 9,887,288.

(51) Int. Cl.
*H01L 29/78* (2006.01)
*H01L 29/66* (2006.01)
(Continued)

(52) U.S. Cl.
CPC .... *H01L 29/7816* (2013.01); *H01L 21/26513* (2013.01); *H01L 21/324* (2013.01); *H01L 29/0653* (2013.01); *H01L 29/0696* (2013.01); *H01L 29/086* (2013.01); *H01L 29/0878* (2013.01); *H01L 29/1083* (2013.01);
(Continued)

(58) Field of Classification Search
CPC ... H01L 29/7816–7826; H01L 29/7833–7836; H01L 29/66681–66704; H01L 29/66659; H01L 29/1095; H01L 29/7835
See application file for complete search history.

(56) References Cited

U.S. PATENT DOCUMENTS 6,117,738 A * 9/2000 Tung ................... H01L 29/7835
257/333
6,531,355 B2    3/2003 Mosher
(Continued)

*Primary Examiner* — Eric A. Ward
(74) *Attorney, Agent, or Firm* — Andrew R. Ralston; Charles A. Brill; Frank D. Cimino

(57) ABSTRACT

A laterally diffused metal oxide semiconductor (LDMOS) device includes a substrate having a p-epi layer thereon, a p-body region in the p-epi layer and an ndrift (NDRIFT) region within the p-body to provide a drain extension region. A gate stack includes a gate dielectric layer over a channel region in the p-body region adjacent to and on respective sides of a junction with the NDRIFT region. A patterned gate electrode is on the gate dielectric. A DWELL region is within the p-body region. A source region is within the DWELL region, and a drain region is within the NDRIFT region. An effective channel length (Leff) for the LDMOS device is 75 nm to 150 nm which evidences a DWELL implant that utilized an edge of the gate electrode to delineate an edge of a DWELL ion implant so that the DWELL region is self-aligned to the gate electrode.

40 Claims, 6 Drawing Sheets

(51) Int. Cl.
  *H01L 29/10*   (2006.01)
  *H01L 29/06*   (2006.01)
  *H01L 29/08*   (2006.01)
  *H01L 29/167*  (2006.01)
  *H01L 21/265*  (2006.01)
  *H01L 21/324*  (2006.01)
  *H01L 29/423*  (2006.01)

(52) U.S. Cl.
  CPC ........ *H01L 29/1095* (2013.01); *H01L 29/167* (2013.01); *H01L 29/66659* (2013.01); *H01L 29/66681* (2013.01); *H01L 29/7835* (2013.01); *H01L 29/0692* (2013.01); *H01L 29/0847* (2013.01); *H01L 29/1045* (2013.01); *H01L 29/42368* (2013.01)

(56) References Cited

U.S. PATENT DOCUMENTS

| | | | |
|---|---|---|---|
| 6,593,621 B2 | 7/2003 | Tsuchiko et al. | |
| 6,841,879 B2 | 1/2005 | Murakami | |
| 6,888,210 B2* | 5/2005 | Jeon | H01L 29/1083 257/492 |
| 6,933,560 B2* | 8/2005 | Lee | H01L 29/086 257/328 |
| 7,408,234 B2 | 8/2008 | Ichijo | |
| 7,649,225 B2* | 1/2010 | Cai | H01L 21/823425 257/343 |
| 7,713,825 B2 | 5/2010 | Hu et al. | |
| 7,736,983 B2 | 6/2010 | Kohli et al. | |
| 7,776,700 B2* | 8/2010 | Yang | H01L 29/0847 438/286 |
| 8,174,071 B2 | 5/2012 | Tien et al. | |
| 9,461,046 B1* | 10/2016 | Edwards | H01L 27/0928 |
| 9,887,288 B2* | 2/2018 | Edwards | H01L 29/7816 |
| 2002/0125542 A1* | 9/2002 | Suzuki | H01L 29/66325 257/500 |
| 2003/0151089 A1* | 8/2003 | Edwards | H01L 29/0696 257/328 |
| 2006/0011975 A1 | 1/2006 | Yonemoto | |
| 2007/0246771 A1* | 10/2007 | McCormack | H01L 29/0878 257/335 |
| 2009/0294849 A1* | 12/2009 | Min | H01L 29/063 257/337 |
| 2011/0062517 A1* | 3/2011 | Yoshinaga | H01L 29/42376 257/337 |
| 2015/0041892 A1* | 2/2015 | Hebert | H01L 29/1095 257/339 |
| 2015/0325651 A1* | 11/2015 | Yao | H01L 29/7835 257/339 |
| 2017/0243937 A1* | 8/2017 | Ward | H01L 29/7827 |

* cited by examiner

LDMOS DEVICE WITH BODY DIFFUSION SELF-ALIGNED TO GATE

CROSS-REFERENCE TO RELATED APPLICATION(S)

This application is a divisional of and claims priority to U.S. patent application Ser. No. 14/957,223 filed on Dec. 2, 2015, which is hereby incorporated by reference in its entirety.

FIELD

Disclosed embodiments relate to laterally diffused metal oxide semiconductor (LDMOS) devices.

BACKGROUND

As DC-DC converters are scaled to the next generation of power converter products, there is a need to increase the switching frequency to reduce the size of the external passive components such as inductors while maintaining low power dissipation in its integrated power field effect transistors (FETs), such as LDMOS devices. In an LDMOS device, the drain is laterally arranged to allow current to laterally flow, and a drift region is interposed between the channel and the drain to provide a high drain to source breakdown voltage. This involves reducing the switching parasitics Qgate and Cdrain of the power FET while the ON-state resistance is also reduced.

Qgate is the charge required to turn ON the power FET gate during a switching transition in which the drain goes essentially between the power supply rails. Qgate causes (1) a power loss because this switching charge is not recovered during the switching process and (2) degraded area utilization because the circuitry needed to drive the gate of a large area power FET may occupy a significant fraction of the die area. Cdrain is the drain capacitance, which dictates how much charge is lost to switching per switching transition. RSP is the area-normalized ON-state resistance of the power FET. Conventionally, a new integrated power (e.g., linear BiCMOS (LBC)) technology will reduce the RSP so that the total ON resistance of a power switch may be attained at a reduced die area, hence reducing the product cost.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include laterally diffused metal oxide semiconductor (LDMOS) devices and processes for forming such devices that enables the reduction of the parasitics Qgate, Cdrain and area-normalized ON-state resistance (RSP). As used herein, an LDMOS device is synonymous with a diffused metal oxide semiconductor (DMOS) device. A conventional n-LDMOS power device uses a masked boron body implant then a diffusion both early in the process flow to form what is referred to herein as a DWELL region before the polysilicon gate and shallow p-type and n-type wells (SPWELL and SWELL) are added that complete the p-type body region and form n-type source extension, respectively, of the LDMOS device. Historically, the DWELL process has used long furnace anneals and/or a MeV (or near-MeV) boron buried layer (PBL) implant to achieve a laterally graded p-body doping profile in the channel that creates a built-in electric field which accelerates movement of the electrons, improving the current drive capability of the LDMOS device.

Furthermore, the position of the DWELL process early in the conventional process flow is recognized to create misalignment between the edges of the DWELL diffusions and the gate electrode which is generally a polysilicon gate, that also prevents reducing the effective channel length of the LDMOS device. As used herein the effective channel length ($L_{EFF}$) for disclosed n-channel LDMOS devices refers to the width of the net p-type region (majority carriers) of the semiconductor (e.g., silicon) surface (or within about 100 Angstroms of this surface which is the width of the quantum mechanical ground state forming the inversion layer, wherever the narrowest in width) between the source and drain under the gate electrode over the gate dielectric, specified at all zero device terminal voltages. Taken together, the long DWELL diffusion time, lateral straggle from the high energy PBL implant, and lithographic misalignment variation between DWELL mask and the gate electrode material (e.g., polysilicon) results in the $L_{EFF}$ being at least 200 nm, typically being ≥500 nm (0.5 µm). A long minimum $L_{EFF}$ (e.g., being ≥0.5 µm) sets a lower limit (minimum) on the gate capacitance, RSP, the current drive (Idrive) also known as IDsat (the drain current in the saturation region), and Idlin being the drain current in the linear region (from which RDSon and RSP are calculated) for the LDMOS device.

Disclosed embodiments provide a LDMOS design and associated process flow including a DWELL process comprising at least a DWELL p-type (e.g., boron) implant that is self-aligned to the gate electrode (e.g., polysilicon gate) by having at least one edge of the gate electrode included in a photomask opening for the DWELL so that the gate electrode delineates an edge of the DWELL implant. This enables the $L_{EFF}$ of the LDMOS device to be reduced significantly (e.g., $L_{EFF}$ 75 nm to 150 nm) to be smaller than that of a conventional LDMOS by at least about a factor of 2 in order to provide next-generation power field effect transistor (FET) performance.

BRIEF DESCRIPTION OF THE DRAWINGS

Reference will now be made to the accompanying drawings, which are not necessarily drawn to scale, wherein.

DETAILED DESCRIPTION

Figure 1:
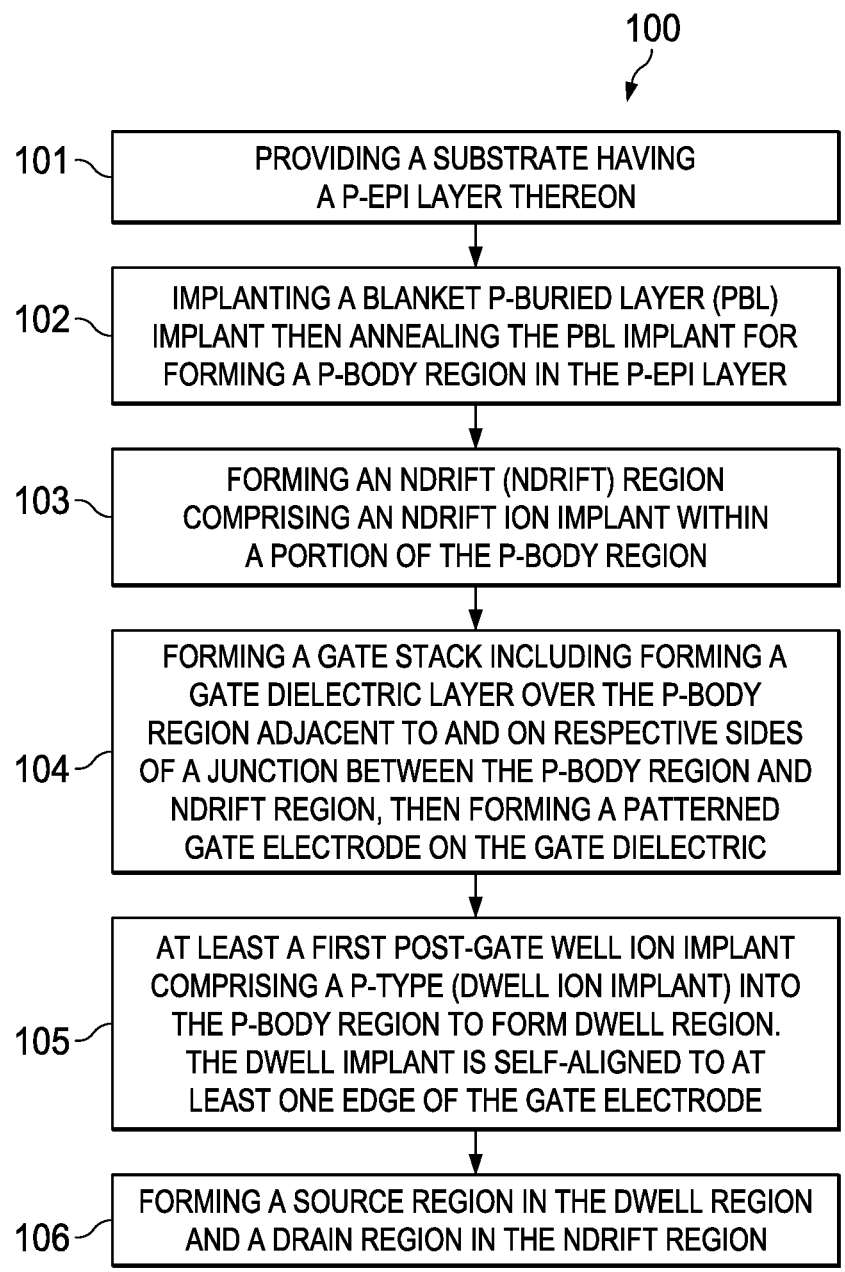
FIG. 1 is a flow chart that shows steps in an example method for forming a disclosed LDMOS device with a DWELL region self-aligned to the gate electrode, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include LDMOS fabrication processes having a new DWELL process flow, and LDMOS devices therefrom generally having an $L_{EFF}$ of only 75 nm to 150 nm. The DWELL process is moved to just after the gate stack formation (instead of conventionally being before), and if part of a BiCMOS process that only for example disclosed methods are described as being part of, before the CMOS lightly doped drain (LDD) loop (typically comprising NLDD2, NLDD, PLDD, PLDD2 implants and activation anneals) using processing similar to NLDD processing. A dedicated (optional) DWELL rapid thermal anneal (RTA) process can be added after the Dwell implant (s) to (1) activate the DWELL dopant(s) and (2) to drive the DWELL p-type dopant slightly to achieve better ON-state breakdown voltage (BVII) and a more controllable voltage threshold (VT) for the LDMOS device.

Figure 2A:
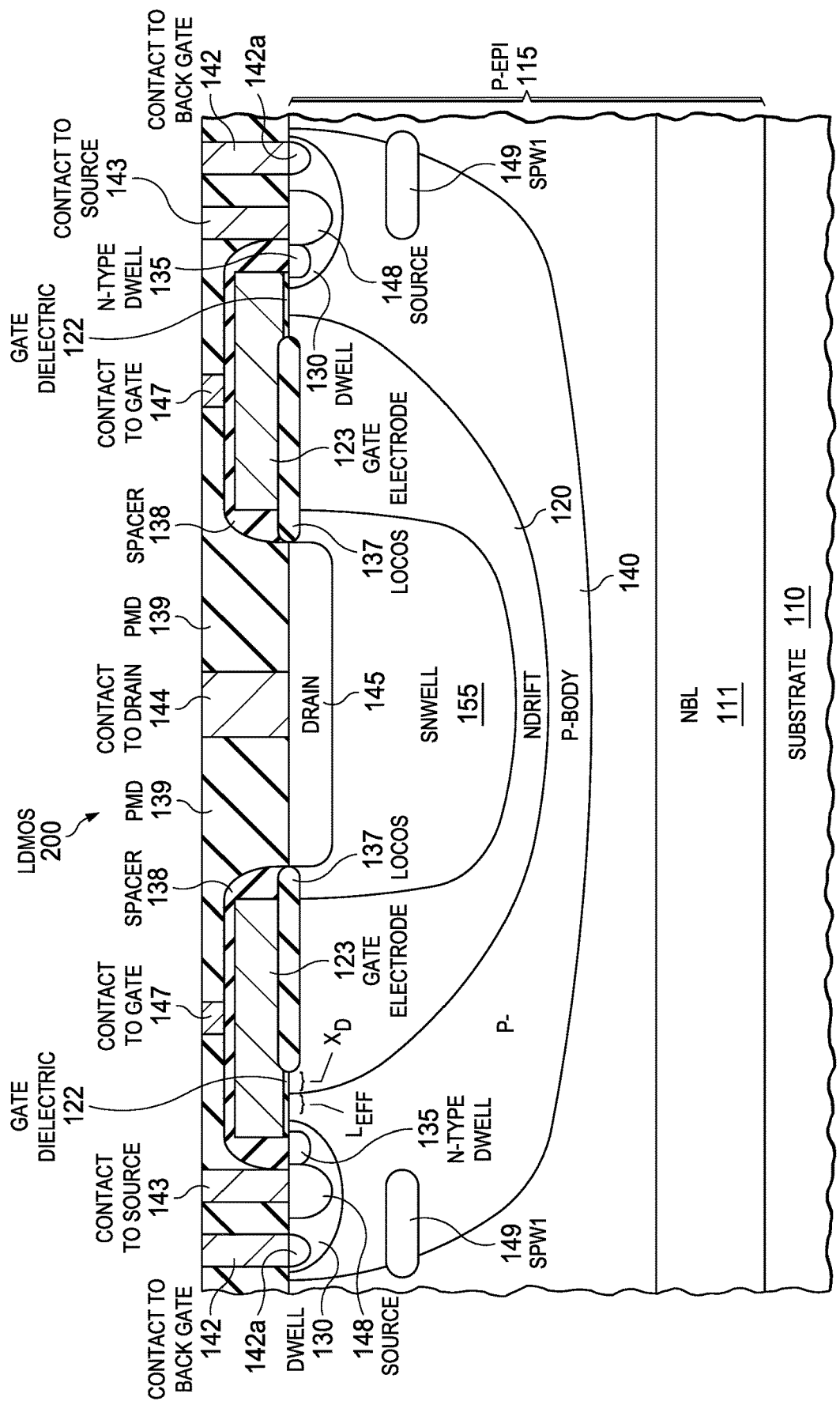
FIG. 2A is a cross-sectional diagram showing an example LDMOS device having a DWELL region evidencing a DWELL implant that utilized at least one edge of the gate electrode to delineate an edge of a DWELL ion implant so that the DWELL region is self-aligned to the gate electrode, according to an example embodiment.

FIG. 1 is a flow chart that shows steps in an example method 100 for forming a disclosed LDMOS device with a DWELL region that is self-aligned to the gate electrode, according to an example embodiment. FIG. 2A is a cross-sectional diagram showing an example LDMOS device having a DWELL region 130 evidencing a DWELL implant that utilized at least one edge of the gate electrode to delineate an edge of a DWELL ion implant so that the resulting DWELL region evidences self-alignment to the gate electrode, with the evidence of the self-alignment including an Leff for the LDMOS device being only 75 nm to 150 nm, according to an example embodiment. Method 100 is described using a BiCMOS process flow which as known in the art combines bipolar and CMOS technology. Although n-channel LDMOS transistors are described herein, it is clear to one having ordinary skill in the art to use this information to form p-channel LDMOS transistors, by n-doped regions being substituted by p-doped regions and vice versa.

Step 101 comprises providing a substrate 110 having a p-epi layer 115 thereon. The p-epi layer 115 may be about 15 µm to 40 µm thick. The process can comprise forming a first epi layer on the substrate, forming a blanket n+ buried layer (NBL) 111, and then forming a second epi layer over the NBL 111. The substrate 110 is generally a p+ or p− substrate, typically boron doped from $1\times10^{16}$ to $1\times10^{19}$ cm$^{-3}$, and the p-epi layer 115 can have a doping level from $3\times10^{14}$ cm$^{-3}$ to $3\times10^{16}$ cm$^{-3}$. The substrate 110 and the p-epi layer 115 can both comprise silicon, and can also comprise other materials.

Disclosed LDMOS devices can include an isolation structure. For example, an outer n-type tank can be formed in several ways. A deep trench (DT) can have an optional dielectric liner and NBL, DEEPN and NBL, DNWELL and NBL, and shallow nwell (SNW), BISO, and NBL. BISO is a phosphorus implant performed before the second epi process (in a two epi process) at the edges of the NBL 111 (but after the NBL furnace drive which diffuses the NBL 111 deeper into the semiconductor such as Si). The BISO diffuses up into the second p-epi, enabling an n-tank connection to be established with SNW for example (hence avoiding the use of a DEEPN which is sometimes desirable). In all of these cases, the NBL 111 forms the bottom of the n-type tank and the other element (DT, DEEPN, etc.) forms the vertical walls of the n-tank that connect up to the top semiconductor surface, such a top Si surface having n+ doping (from the NSD), silicide and contacts.

Step 102 comprises the optional step of implanting a blanket PBL implant then annealing the PBL implant for forming a p-body region 140 above the NBL 111 in the p-epi 115. The PBL implant can use a boron dose from $1\times10^{12}$ cm$^{-2}$ to $1\times10^{13}$ cm$^{-2}$, at an energy of 400 keV to 3 MeV. Instead of a PBL implant, the doping level in the p-epi layer 115 can alternatively be increased to control the background boron doping level in the p-body region 140.

Figure 3:
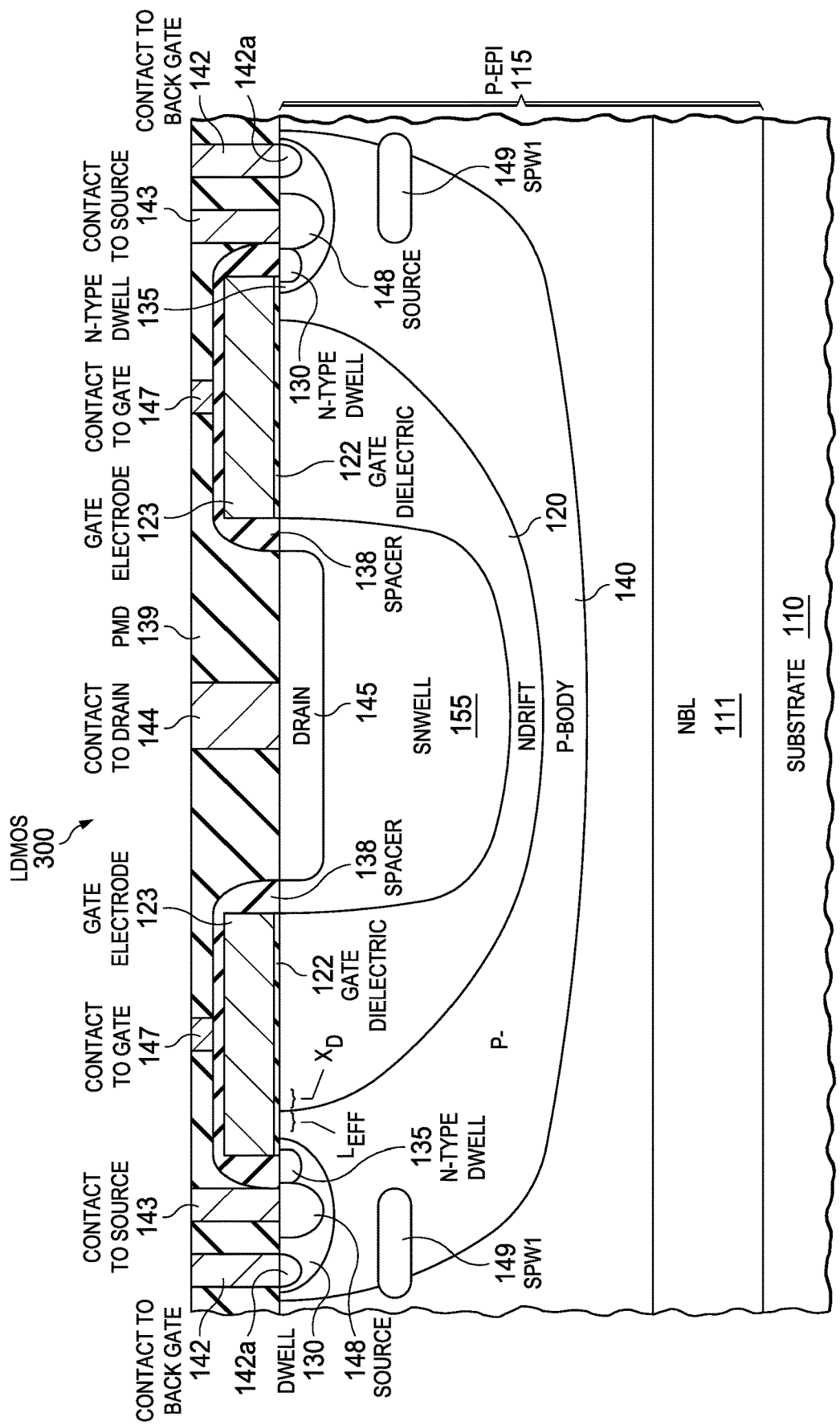
FIG. 3 shows a planar version of a disclosed LDMOS device (no LOCal Oxidation of Silicon (LOCOS) layer) having a DWELL region evidencing a DWELL implant that utilized at least one edge of the gate electrode to delineate an edge of a DWELL ion implant so that the DWELL region is self-aligned to the gate electrode, according to an example embodiment.

Step 103 comprises forming an ndrift (NDRIFT) region 120 comprising an NDRIFT ion implant within a portion of the p-body region 140. The NDRIFT region 120 provides the drain extension region for LDMOS device 200. For LDMOS device 200 a local oxidation process follows to form LOCOS layer 137. However, as shown in FIG. 3, in another embodiment the LDMOS device is a "planar" device that lacks the LOCOS layer 137.

In addition, after step 103 a SNW and shallow pwell (SPW) may also be formed. The region shown in FIG. 2A as SPW1 149 is a part of the SPW which can be from a BiCMOS process utilizing the conventional shallow p-body implant used to form the CMOS logic and 5V NMOS body diffusions which may both be optionally implanted (generally with a plurality of implants to provide different implant energies) for the LDMOS device 200 to form a deep p-body doping region for the LDMOS device. The body doping provided by SPW1 149 increases the base doping level to suppress the parasitic lateral NPN bipolar formed by n+ source-p-body-n+ drain. This parasitic NPN bipolar can limit the high current operation for LDMOS device 200 as it can form a boundary to the safe operating area (SOA). The SNW which is optional is shown as SNWell 155 in FIG. 2A.

The implants in step 102 (PBL), step 103 (NDRIFT), as well as the SNW and SPW implants, can generally be performed be in any order. The method can also include an RTA damage anneal after all of these implants that heals the implant induced lattice damage.

Step 104 comprises forming a gate stack including forming a gate dielectric layer 122 over the p-body region 140 adjacent to and on respective sides of a junction between the p-body region 140 and NDRIFT region 120, then forming a patterned gate electrode 123 on the gate dielectric layer 122. The gate dielectric layer 122 can be a 5V gate dielectric comprising silicon oxide, which is about 10 to 15 nm thick. It is also possible to use a gate dielectric as thin as about 3 nm of silicon dioxide, or a silicon oxynitride (SION)) gate dielectric that is slightly thinner but with a higher dielectric constant than that of silicon dioxide which is about 3.9. Polysilicon is one example gate electrode material for the gate electrode 123. However, a metal gate or CMOS-based replacement gate process can also be used to provide the gate electrode 123.

Step 105 comprises at least a first post-gate well ion implant comprising a p-type dopant (DWELL ion implant) into the p-body region 140 to form DWELL region 130. Step 105 can comprise 2 or more p-type DWELL ion implants all at different energies. The DWELL ion implant(s) are self-aligned to at least one edge of the gate electrode 123 (e.g. polysilicon), which enables the short Leff provided by disclosed LDMOS devices (e.g., 75 nm to 150 nm) by having at least one edge of the gate electrode included in a photomask opening for the DWELL ion implant so that the gate electrode 123 delineates an edge of the DWELL ion implant and as a result the DWELL is self-aligned to the gate. The DWELL mask opening that encloses the gate electrode's 123 opening for the source and integrated back-gate region exposes the gate electrode 123 by a minimum amount (such as 25 nm to 150 nm depending on the alignment capability of the lithography equipment) to ensure that the DWELL implant is masked by the edge(s) of the gate electrode 123.

The short Leff (e.g., 75 nm to 150 nm) provided by disclosed LDMOS devices is a characteristic signature obtainable from a top-view image, such as obtained by using a Scanning Capacitance Microscope image of the doping profile or a Scanning Spreading Resistance Microscope image. Having a relatively heavy and steeply graded shallow p-type doping (from the self-aligned DWELL ion implant) that is about as deep as the PSD or PLDD2 for MOS devices on the BiMOS IC in the case of a BiMOS process flow would be another characteristic signature. Conventional DWELL doping would not only extend further into the LDMOS channel, it would be more uniform and spread out substantially more vertically. Yet another characteristic signature is the doping symmetry of the shallow DWELL p-type implant on respective sides of the gate electrode 123 when the gate electrode provides 2 mask edges for the Dwell implant (such as with a racetrack shaped gate electrode, see FIG. 2B) analogous to the symmetric doping in the sources and drains for conventional MOS devices having self-aligned gates for the S/D implant processes.

The DWELL p-type implant energy can be similar to the energy used for the boron PSD and PLDD2 steps in a BiCMOS process, and the dose should generally be sufficient to form a channel laterally and to suppress parasitic body NPN effects. For example, a boron implant with an energy of 20 keV, a dose of $8 \times 10^{13}$ cm$^{-2}$ to $3.0 \times 10^{14}$ cm$^{-2}$, such as $1.5 \times 10^{14}$ cm$^{-2}$, and a tilt angle of less than 5 degrees, such as 2 degrees, may be used. However, besides boron the DWELL p-type implant can also use indium (In). The energy for this implant is at a low-energy to avoid penetrating through the exposed gate electrode 123, such as comprising polysilicon. The DWELL boron implant being vertical or near vertical (e.g., a 2 degree tilt) and the dose relatively high ($1.5 \times 10^{14}$ cm$^{-2}$), both of which characteristics are recognized to be advantageous in suppressing body NPN action while maintaining a well-formed channel region. The SPWELL implant described above being before the gate processing allows the SPW1 region 149 to provide a deeper portion of the p-body doping, which further suppresses the parasitic NPN.

An optional DWELL n-type dopant such as arsenic (or antinomy) can also be added, with n-type DWELL 135 shown in FIG. 2A, with the arsenic (or antinomy) implant and the p-type Dwell implant being in either order. For example, an arsenic implant with a dose $4 \times 10^{14}$ cm$^{-2}$ to $1.2 \times 10^{15}$ cm$^{-2}$ (e.g., $8 \times 10^{14}$ cm$^{-2}$), an energy 4 to 30 keV (e.g., 15 keV), and a 15 degree ion implant tilt angle may be used to form n-type DWELL 135 in one particular embodiment, or some or all of this implant angled at for example 45 degrees (2 or 4 rotations). An arsenic implant energy of about 15 keV allows the arsenic to penetrate through the gate dielectric 122 (e.g., when a 5V oxide) adjacent to the gate electrode 123 and also reduces the doping concentration there by counter doping so as to reduce gate-induced parametric shifts. The 15 degree or so arsenic (or antinomy) implant angle can reduce the voltage threshold (Vt) without reducing the DWELL p-type implant dose, enabling the simultaneous improvement of Vt and control of the body doping of the parasitic NPN. The DWELL p-type implant and optional Dwell arsenic (or antinomy) implant can use the same mask. However, it is possible for the NLDD implant (for a BiCMOS process flow) to be used together with a DWELL containing only the p-type implant.

The DWELL activation/drive for disclosed polysilicon gate processes can comprise a polysilicon oxidation step that already is included in a conventional BiMOS process flow, which is after gate patterning, gate etching and gate photoresist removal, being a short thermal oxidation that oxidizes the sidewalls of the polysilicon slightly, and forms a "polysilicon smile" which is a slight thickening of the gate oxide at the edges of the polysilicon gate. The DWELL activation/drive can also comprise an RTA process to activate the Dwell dopant(s) and to slightly laterally spread out the doping distribution, which helps to form a well-defined LDMOS device channel and to suppress the parasitic body NPN bipolar action. For example, an RTA at about 1,000° C. for 1 to 4 minutes may be used in one particular embodiment. The n-type source-drain implant (NSD) may be optionally co-patterned with the DWELL to reduce source resistance and to improve the polysilicon gate n-type doping when the gate electrode material comprises polysilicon.

Sidewall spacers 138 are generally formed on sidewalls of the gate electrode 123. A thin layer of the spacer material is also optionally shown on top of the gate electrode 123. The spacer material being on top of the gate electrode 123 shown in FIG. 2A may or may not be present. In one embodiment the sidewall spacers 138 comprise silicon nitride. A premetal dielectric (PMD) 139 is shown including over the spacers 138.

Step 106 comprises forming an n+ source (source) region 148 in the DWELL region 130 and an n+ drain (drain) region 145 in the NDRIFT region 120. Contact (e.g., optional silicide, PMD 139, and vias) and metallization processing generally follow, including contact to back gate 142 which contacts DWELL region 130, contact to source 143, contact to drain 144, and contact to gate 147.

Using this disclosed DWELL process and associated LDMOS layout, because the DWELL is self-aligned to edge(s) of the gate electrode, as described above, the $L_{EFF}$ of the LDMOS device may be reduced to as low as 75 nm. The reduced $L_{EFF}$ enables a significant improvements to both RSP and Qgate. The LDMOS device 200 also has its $X_D$ parameter shown in FIG. 2A corresponding to the active portion of the gate dielectric 122 over the outer edge of NDRIFT region 120, which is generally only 200 nm to 300 nm. The previous technology node LDMOS device has an $X_D$ of about 500 nm to 1,000 nm. $X_D$ is reduced by disclosed embodiments because of sharper DWELL doping, making a sharper pn junction, providing the opportunity to use of a sharper NDRIFT 120 doping profile. Since this disclosed feature makes everything smaller, it is noted lithographic alignment generally becomes more important, so that the self-aligned nature of the disclosed DWELL processing generally becomes more important.

There are generally three different types of LDMOS devices for power converter applications, such as for a half-bridge Buck DC/DC Converter in one particular application. A low-side LDMOS transistor has the source and body region tied to ground, so such LDMOS devices can operate in the p-epi 115 without any isolation (i.e., no deep trench (DT), no NBL, no BISO, and no DEEPN sinker). Another LDMOS device is an ISO LDMOS transistor built into an n-type tank. The ISO terminal is the n-tank, and it can be biased separately from the source/backgate region and the drain. Yet another LDMOS device for high side applications is built similar to the ISO LDMOS transistor, but the ISO and drain are tied together electrically (usually through metal 1 (MET1)). For each of these types of LDMOS devices there is a need to increase the switching frequency to reduce the size of the external passive components such as inductors while maintaining a low power dissipation in the integrated power FETs. This involves reducing the switching parasitics Qgate and Cdrain of the power FET while the ON-state resistance RSP is being reduced, which are all reduced by disclosed LDMOS devices provide.

Figure 2B:
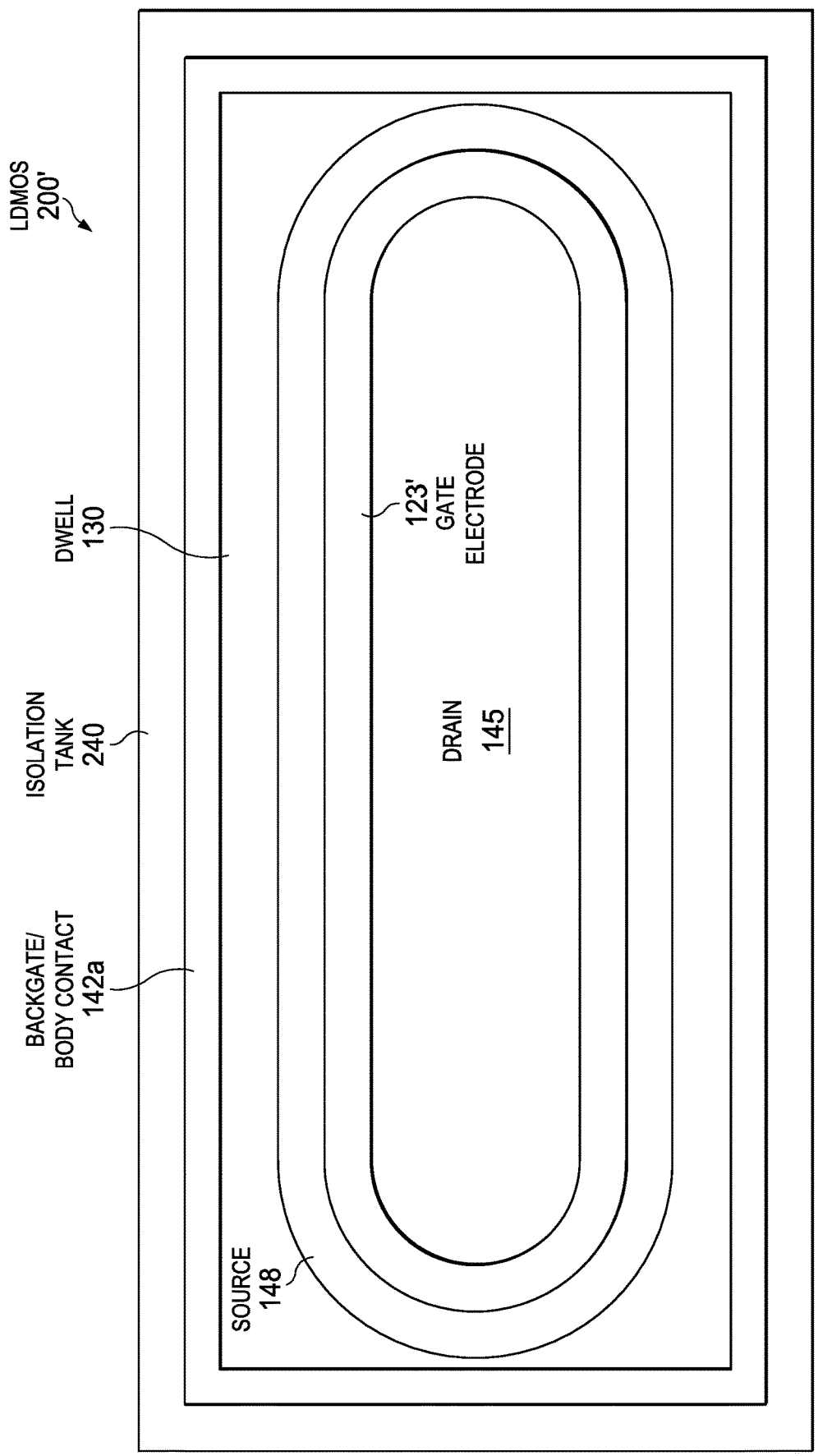
FIG. 2B is a top view of example LDMOS device having a DWELL region evidencing a DWELL implant that utilized edges of the gate electrode to delineate edges of a DWELL ion implant so that the DWELL region is self-aligned to the gate electrode, where the gate electrode is in a racetrack configuration, according to an example embodiment.

FIG. 2B is a top view of example LDMOS device 200' having a DWELL region 130 evidencing a DWELL implant that utilized edges of the gate electrode 123' to delineate edges of a DWELL ion implant so that the DWELL region 130 is self-aligned to the gate electrode 123, where the gate electrode 123' is in a racetrack configuration, according to an example embodiment. An isolation tank 240 is shown framing LDMOS device 200' which as described above can comprise an NBL together with an n+ sinker providing vertical walls coupling a top surface of the p-epi 115 to the NBL 111. The backgate/body contact region is shown as 142a is an integrated backgate contact, which is at the surface of the Dwell region 130. The backgate/body contact region 142a can be formed within the DWELL region 130 by adding a p+ SD (PSD) implant used for the CMOS section, which is very heavily (p+) boron doped. One arrangement has a plurality of backgate PSD stripes or squares in conventional geometries, with an NSD implant covering areas of the source/backgate region not covered with the PSD for low resistance contact to the source 148. Backgate/body contact region 142a allows the p-type body region (Dwell region 130 and p-body 140) to be ohmically shorted to the n+ source 148 through a silicide layer.

For LDMOS device 200' the DWELL mask is patterned, stopping on the gate electrode 123' on both sides. It is generally desirable to avoid extending the DWELL mask opening too far into the gate electrode 123' to avoid counterdoping the polysilicon with the p-type DWELL implant.

FIG. 3 shows a planar version of a disclosed LDMOS device 300 (no LOCOS layer 137 shown in FIG. 2A) having a DWELL region 130 evidencing a DWELL implant that utilized an edge of the gate electrode to delineate an edge of a DWELL ion implant so that the DWELL region 130 is self-aligned to the gate electrode 123, according to an example embodiment. As described above, The DWELL mask is patterned, in this case the pattern stopping on the gate electrode 123 (e.g. polysilicon) on both sides of the racetrack shape.

The p-type source-drain implant (PSD) for the CMOS circuitry may be optionally patterned to provide back-gate/body contact 142a (formed adjacent to the NSD+ DWELL region) to reduce the base resistance of the p-body 140 of the parasitic NPN, further suppressing body NPN action. The DWELL mask may optionally extend across the backgate/body contact 142a or it may stop adjacent to the PSD edge. The PLDD2 (a pure p-type SD extension implant used to form 5V PMOS) may optionally also be added to the backgate/body contact 142a, optionally extending partway into the n-type DWELL 135 in FIG. 2A to reinforce the p-type body doping therein, thus further suppressing the parasitic body NPN action.

EXAMPLES

Disclosed embodiments are further illustrated by the following specific Examples, which should not be construed as limiting the scope or content of this Disclosure in any way.

Figure 4A:
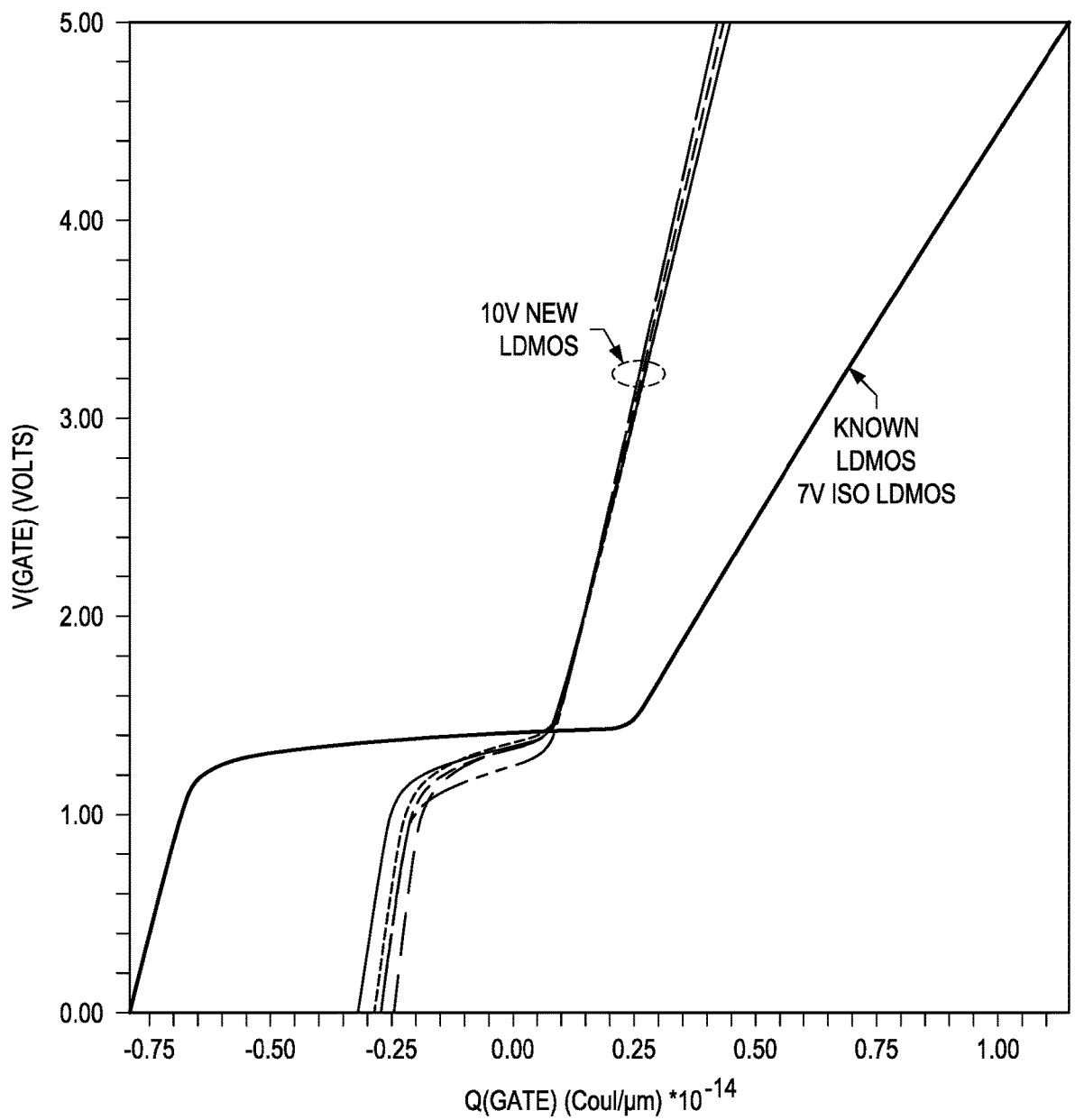
FIG. 4A shows a simulated VGate vs. QGate plot for a disclosed LDMOS device vs. a known LDMOS device.

FIG. 4A shows a simulated VGate vs. QGate plot for a disclosed LDMOS device (shown as "10 V New LDMOS") similar to LDMOS device 200 having LOCOS layer 137 vs. a known LDMOS device (shown as "Known LDMOS 7V ISO LDMOS"). As described above, known LDMOS device has the DWELL early in the process (before gate) which is recognized to create misalignment between the edges of the DWELL diffusions and the polysilicon gate, which results in an $L_{EFF}$ of the LDMOS device to be at least 200 nm, typically being ≥500 nm (0.5 µm). Qgate is shown to be significantly improved by the short Leff provided (about 100 nm) and the LOCOS layer.

Figure 4B:
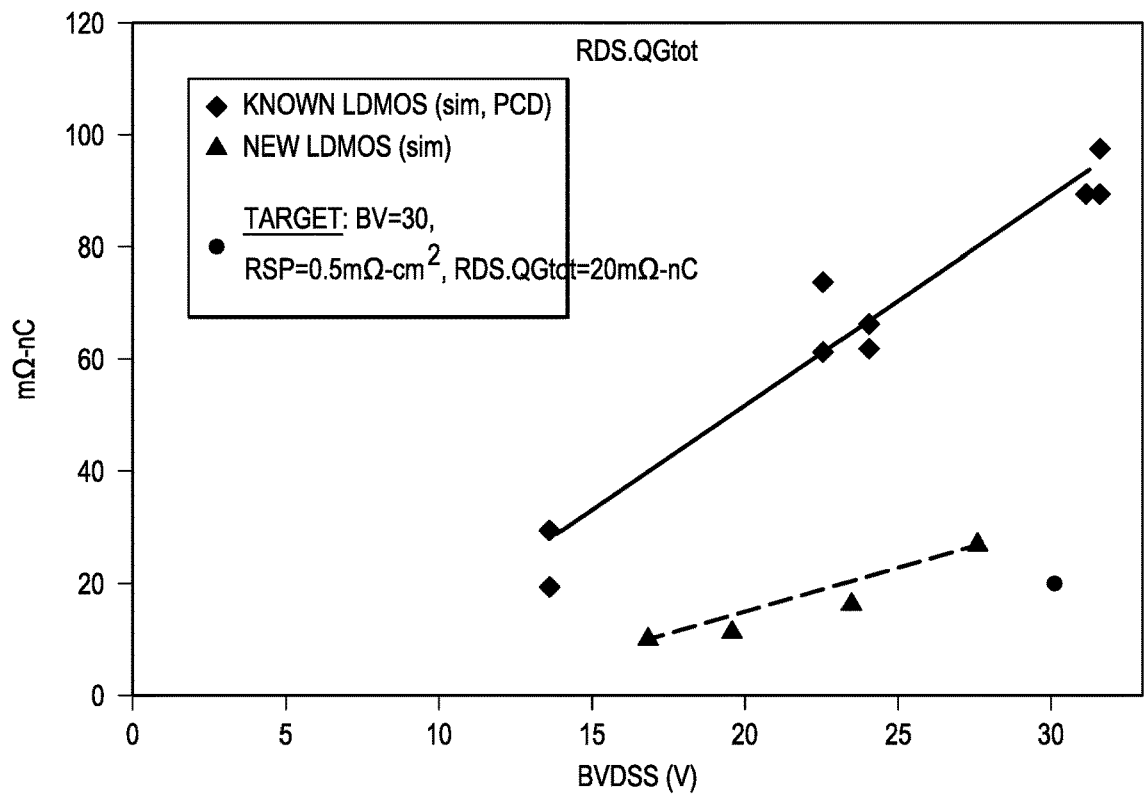
FIG. 4B shows simulated data of $RDS.QG_{tot}$ for the disclosed LDMOS device vs. the known LDMOS device.
Figure 4C:
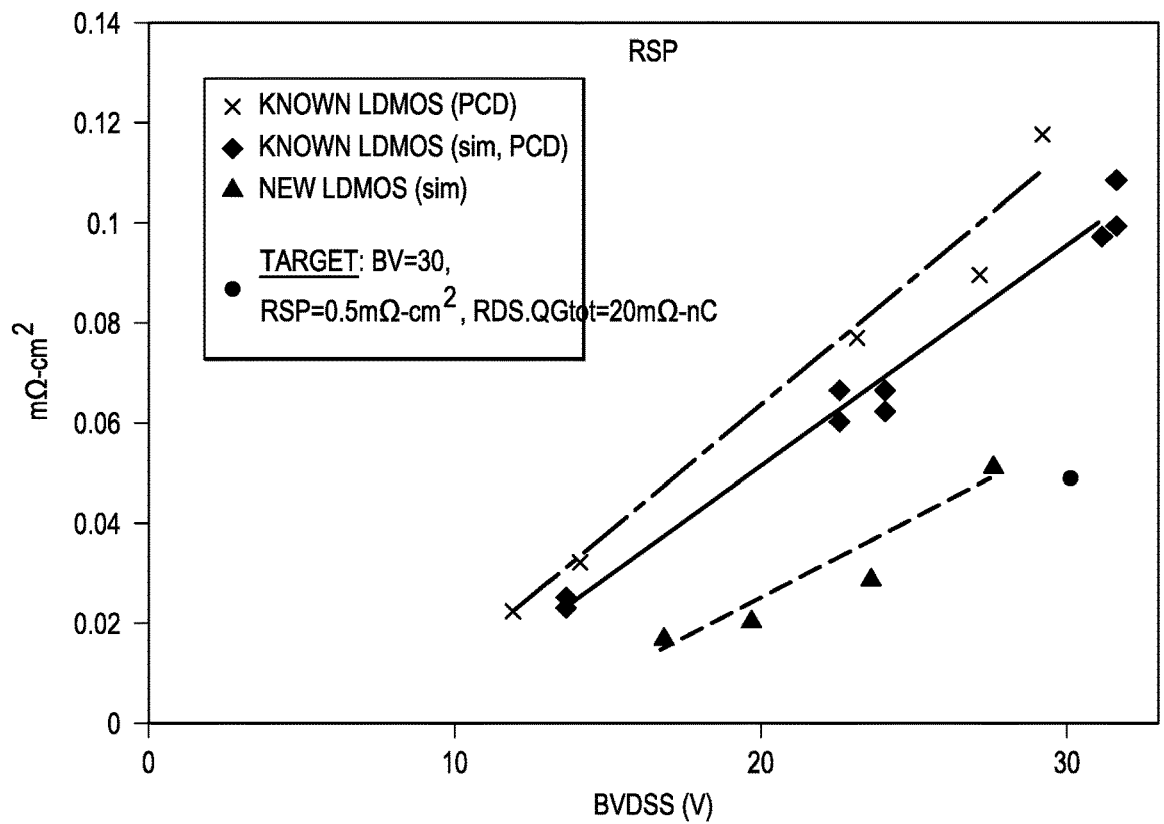
FIG. 4C shows simulated data of RSP for the disclosed LDMOS device vs. the known LDMOS device.

FIG. 4B shows simulated data of RDS.QGtot for the disclosed LDMOS device (shown as "New LDMOS") vs. the known LDMOS device. RDS.QGtot is shown to be substantially reduced by the disclosed LDMOS device. FIG. 4C shows simulated data of RSP for the disclosed LDMOS device (again shown as "New LDMOS") vs. known LDMOS devices. RSP is shown to also be substantially reduced by the disclosed LDMOS device. These parameters are significantly improved over known LDMOS devices while it has been also found the LDMOS device's ability to hold off drain voltage is preserved (i.e. the drain-source breakdown voltage (BVDSS) is not sacrificed) and low junction leakage is maintained.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A laterally diffused metal oxide semiconductor (LDMOS) device, comprising:
   a substrate;
   a p-epi layer disposed on the substrate;
   a p-body region disposed in the p-epi layer;
   an n-type region disposed in and surrounded laterally and vertically by and touching the p-body region;
   an n-type drain region disposed in and surrounded laterally and vertically by and touching the n-type region;
   a gate stack including:
      a gate dielectric layer disposed over a channel region in the p-body region, wherein the gate dielectric layer is adjacent to and on respective sides of a junction between the p-body region and the n-type region; and
      a gate electrode disposed over the gate dielectric layer;
   a DWELL region disposed in the p-body region, wherein the DWELL region has a first edge delineated by a first edge of the gate electrode; and
   a source region disposed in the DWELL region.

2. The LDMOS device of claim 1, wherein the substrate comprises silicon.

3. The LDMOS device of claim 1, comprising sidewall spacers disposed on sidewalls of the gate electrode.

4. The LDMOS device of claim 1, wherein:
   the gate dielectric layer comprises silicon oxide or silicon oxynitride (SiON); and
   the gate electrode comprises polysilicon.

5. The LDMOS device of claim 1, comprising an isolation tank comprising an n+ buried layer (NBL) in the p-epi layer and an n+ sinker providing vertical walls coupling a top surface of the p-epi layer to the NBL.

6. The LDMOS device of claim 1, comprising a local oxidation of silicon (LOCOS) layer disposed over a portion of the N-type region, wherein the gate electrode is disposed over at least a portion of the LOCOS layer.

7. The LDMOS device of claim 6, wherein the LOCOS layer is spaced apart from the junction between the p-body region and the N-type region by a portion of the N-type region.

8. The LDMOS device of claim 1, wherein the LDMOS device is a planar device.

9. The LDMOS device of claim 1, wherein the gate electrode is arranged in a racetrack geometry.

10. The LDMOS device of claim 1, comprising an integrated backgate/body contact region at a surface of the DWELL region.

11. The LDMOS device of claim 1, comprising a shallow n-type well disposed in the N-type region, wherein the drain region is disposed in the shallow n-type well and the p-body region extends from the channel region under the drain region.

12. The LDMOS device of claim 11, wherein a second edge of the gate electrode delineates an edge of the shallow n-type well.

13. The LDMOS device of claim 1, comprising an n-type DWELL region disposed in the DWELL region between the source region and the first edge of the DWELL region.

14. The LDMOS device of claim 13, wherein at least a portion of the n-type DWELL region is overlapped by the gate stack.

15. The LDMOS device of claim 1, comprising a shallow p-type well disposed at least partially in the p-body region, but outside of the N-type region.

16. The LDMOS device of claim 15, wherein the DWELL region is disposed over the shallow p-type well.

17. The LDMOS device of claim 16, wherein the DWELL region is separated from the shallow p-type well by a portion of the p-body region.

18. The LDMOS device of claim 1, wherein an effective channel length of the LDMOS device is between 75 nm and 150 nm.

19. The LDMOS device of claim 18, wherein the effective channel length is defined between the first edge of the DWELL region and the junction between the N-type region and the p-body region.

20. The LDMOS device of claim 1, wherein the N-type region includes a shallow N-type well disposed in and laterally and vertically surrounded by and touching an N-type drift region.

21. A laterally diffused metal oxide semiconductor (LDMOS) device, comprising:
   a substrate;
   a p-epi layer disposed on the substrate;
   a p-body region disposed in the p-epi layer;
   an NDRIFT region disposed in and laterally surrounded by the p-body region;
   a gate dielectric layer disposed over a channel region in the p-body region, wherein the gate dielectric layer extends from a first end over the NDRIFT region to a second end over a portion of the p-body region outside of the NDRIFT region so that the gate dielectric layer is disposed over a junction between the NDRIFT region and the p-body region;
   a gate electrode disposed over the gate dielectric layer;
   a DWELL region disposed in the p-body region and having an edge delineated by an edge of the gate electrode;
   a source region disposed in the DWELL region;
   a drain region disposed in the p-epi layer and laterally surrounded by the NDRIFT region, the p-body region and the NDRIFT regions extending from the channel region under the drain region such that the NDRIFT region is located vertically between the drain region and the p-body region; and
   a shallow n-type well disposed in the NDRIFT region, wherein the drain region is disposed in the shallow n-type well and the p-body region extends from the channel region under the drain region.

22. The LDMOS device of claim 21, comprising an isolation tank comprising an n+ buried layer (NBL) in the p-epi layer and an n+ sinker providing a vertical wall coupling a top surface of the p-epi layer to the NBL.

23. The LDMOS device of claim 21, comprising a local oxidation of silicon (LOCOS) layer touching the gate dielectric layer, wherein the gate electrode is disposed over the gate dielectric layer and at least a portion of the LOCOS layer.

24. The LDMOS device of claim 21, wherein the gate electrode forms a closed loop around the drain region and has first and second parallel gate electrode sections.

25. The LDMOS device of claim 21, comprising an n-type DWELL region disposed in the DWELL region between the source region and the edge of the DWELL region.

26. The LDMOS device of claim 21, comprising a shallow p-type well disposed at least partially in the p-body region, but outside of the NDRIFT region.

27. The LDMOS device of claim 21, wherein an effective channel length between the edge of the DWELL region and the junction between the NDRIFT region and the p-body region is between approximately 75 nm and 150 nm.

28. The LDMOS device of claim 21, comprising a integrated p+ region disposed in the DWELL region that provides a backgate/body contact.

29. An electronic device, comprising:
a buried layer having a first conductivity type within a semiconductor substrate having a second opposite conductivity type;
a source region located over the buried layer, the source region having a racetrack configuration and including first and second parallel source region sections;
a gate electrode located adjacent to and surrounded by the source region and including first and second parallel gate electrode sections;
a body region having the second conductivity type that extends from the first source region section to the second source region section;
a drift region having the first conductivity type extending from the first gate electrode section to the second gate electrode section;
a shallow well having the first conductivity type within the drift region; and
a drain region within the shallow well and between the first and second parallel gate electrode sections, the shallow well, and body region located vertically between the drain region and the buried layer.

30. The electronic device claim 29, wherein the source region is located within a DWELL region that extends under the gate electrode and the body region defines a channel region at a surface of the semiconductor substrate between the drift region and the DWELL region, the channel region having an effective channel length of 75 nm to 150 nm.

31. The electronic device claim 29, wherein the first conductivity type is N-type and the second conductivity type is P-type.

32. The electronic device claim 29, comprising an isolation tank comprising the buried layer and a sinker having the first conductivity type providing a vertical wall coupling a top surface of the semiconductor substrate to the buried layer.

33. The electronic device claim 29, wherein the shallow well is located vertically between the drain and the drift region.

34. The electronic device claim 29, comprising a local oxidation of silicon (LOCOS) layer and a gate dielectric disposed over a portion of the drift region, the gate electrode disposed over the gate dielectric and at least a portion of the LOCOS layer.

35. The electronic device claim 34, wherein the LOCOS layer is spaced apart from a junction between the body region and the drift region by a portion of the drift region.

36. The electronic device claim 29, wherein the gate electrode is arranged in a racetrack geometry around the drain region.

37. A laterally diffused metal oxide semiconductor (LDMOS) device, comprising:
a substrate;
a p-epi layer disposed on the substrate;
a p-body region disposed in the p-epi layer;
an NDRIFT region disposed in and laterally surrounded by the p-body region;
a gate dielectric layer disposed over a channel region in the p-body region, wherein the gate dielectric layer extends from a first end over the NDRIFT region to a second end over a portion of the p-body region outside of the NDRIFT region so that the gate dielectric layer is disposed over a junction between the NDRIFT region and the p-body region;
a gate electrode disposed over the gate dielectric layer;
a DWELL region disposed in the p-body region and having an edge delineated by an edge of the gate electrode;
a source region disposed in the DWELL region; and
an n-type DWELL region disposed in the DWELL region between the source region and the edge of the DWELL region;
a drain region disposed in the p-epi layer and laterally surrounded by the NDRIFT region, the p-body region and the NDRIFT regions extending from the channel region under the drain region such that the NDRIFT region is located vertically between the drain region and the p-body region.

38. A laterally diffused metal oxide semiconductor (LDMOS) device, comprising:
a substrate;
a p-epi layer disposed on the substrate;
a p-body region disposed in the p-epi layer;
an NDRIFT region disposed in and laterally surrounded by the p-body region;
a gate dielectric layer disposed over a channel region in the p-body region, wherein the gate dielectric layer extends from a first end over the NDRIFT region to a second end over a portion of the p-body region outside of the NDRIFT region so that the gate dielectric layer is disposed over a junction between the NDRIFT region and the p-body region;
a gate electrode disposed over the gate dielectric layer;
a DWELL region disposed in the p-body region and having an edge delineated by an edge of the gate electrode;
a source region disposed in the DWELL region; and
a drain region disposed in the p-epi layer and laterally surrounded by the NDRIFT region, the p-body region and the NDRIFT regions extending from the channel region under the drain region such that the NDRIFT region is located vertically between the drain region and the p-body region,
wherein the gate electrode forms a closed loop around the drain region and has first and second parallel gate electrode sections.

39. A laterally diffused metal oxide semiconductor (LDMOS) device, comprising:
a substrate;
a p-epi layer disposed on the substrate;
a p-body region disposed in the p-epi layer;
an NDRIFT region disposed in and laterally surrounded by the p-body region;
a gate dielectric layer disposed over a channel region in the p-body region, wherein the gate dielectric layer extends from a first end over the NDRIFT region to a second end over a portion of the p-body region outside of the NDRIFT region so that the gate dielectric layer is disposed over a junction between the NDRIFT region and the p-body region;
a gate electrode disposed over the gate dielectric layer;
a DWELL region disposed in the p-body region and having an edge delineated by an edge of the gate electrode, wherein an effective channel length between the edge of the DWELL region and the junction between the NDRIFT region and the p-body region is between approximately 75 nm and 150 nm;
a source region disposed in the DWELL region; and
a drain region disposed in the p-epi layer and laterally surrounded by the NDRIFT region, the p-body region and the NDRIFT regions extending from the channel region under the drain region such that the NDRIFT region is located vertically between the drain region and the p-body region.

40. An electronic device, comprising:
a buried layer having a first conductivity type within a semiconductor substrate having a second opposite conductivity type;
a source region located over the buried layer, the source region having a racetrack configuration and including first and second parallel source region sections;
a gate electrode located adjacent to and surrounded by the source region and including first and second parallel gate electrode sections;
a body region having the second conductivity type that extends from the first source region section to the second source region section;
a drift region having the first conductivity type extending from the first gate electrode section to the second gate electrode section; and
a drain region within the drift region and between the first and second parallel gate electrode sections, the drift region and body region located vertically between the drain region and the buried layer,
wherein the source region is located within a DWELL region that extends under the gate electrode and the body region defines a channel region at a surface of the semiconductor substrate between the drift region and the DWELL region, the channel region having an effective channel length of 75 nm to 150 nm.

* * * * *